(12) United States Patent
Staib

(10) Patent No.: US 6,198,095 B1
(45) Date of Patent: *Mar. 6, 2001

(54) APPARATUS AND METHOD FOR IMAGING A PARTICLE BEAM

(75) Inventor: Philippe Staib, Langenbach (DE)

(73) Assignee: Staib Instruments GmbH (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,985

(22) Filed: Jan. 14, 1998

(30) Foreign Application Priority Data

Jan. 15, 1997 (DE) ............................................. 197 01 192

(51) Int. Cl.⁷ ..................................................... H01J 49/00
(52) U.S. Cl. ...................... 250/287; 250/305; 250/396 R
(58) Field of Search ................................... 205/287, 294, 205/295, 281, 282, 305, 396 R

(56) References Cited

U.S. PATENT DOCUMENTS

| 4,295,046 | * | 10/1981 | Grüter et al. | ......................... | 250/287 |
| 5,654,543 | * | 8/1997 | Li | ......................... | 250/287 |
| 5,825,025 | * | 10/1998 | Kerley | ................................. | 205/287 |

FOREIGN PATENT DOCUMENTS

| 0 488 067 A2 | 6/1992 | (EP) . |
| 58-075754 | 5/1983 | (JP) . |

OTHER PUBLICATIONS

A. Clarke, G. Jennings, and R. F. Willis, "Wave–vector imaging photoelectron spectrometer," Review of Scientific Instruments, 58, No. 8, Aug. 1987, New York, NY.

Yoshimi Horio, "Zero–loss reflection high–energy electron diffraction patterns and rocking curves of the si(111) 7×7 surface obtained by energy filtering," Jpn. J. Appl. Phys, vol. 35 (1996) pp. 3559–3564.

J. A. Venables, C. J. Harland and J. P. Janssen, "Rheed and Theed patterns and dark–field microscopy in a UHV SEM," Inst. Phys. Conf. Ser. No. 41, Copr. 1978; Chapter 5, pp. 313–318.

S.R. Das, L. LeBrun, P.B. Sewell, T. Tyrie, "UHV RHEED system for in–situ studies of sputtered films," Thin Solid Films 270 (1995) pp. 314–319.

B. Muller and M. Henzler, "SPA–RHEED—A novel method in reflection high–energy electron diffraction with extremely high angular and energy resolution," Rev. Sci. Instrum. 66 (11), Nov. 1995.

D. L. Barr and W. L. Brown, "A channel plate detector for electron backscatter diffraction," Rev. Sci. Instrum. 66(6), Jun. 1995.

* cited by examiner

*Primary Examiner*—Kiet T. Nguyen
(74) *Attorney, Agent, or Firm*—Schnader Harrison Segal & Lewis LLP

(57) ABSTRACT

An apparatus and method for imaging on a detector a particle beam of charged particles having a distinct energy distribution and a distinct angle distribution. The apparatus has deflectors which are provided to create in the particle beam essentially parallel particle paths spaced to correspond to their original angle distribution. The deflectors also direct the particle beam to semi-transmissive, aligned filter electrodes, which produce a potential difference to create a deceleration field to allow the particles to pass through by means of energy selectivity.

20 Claims, 6 Drawing Sheets

APPARATUS AND METHOD FOR IMAGING A PARTICLE BEAM

FIELD OF THE INVENTION

The invention relates to devices and processes for detector imaging of a particle beam comprising charged particles having a distinct energy distribution and a distinct angle distribution, and spectrometers with energy and angle resolution.

BACKGROUND OF THE INVENTION

When matter is irradiated, particles from an interactive zone can become irradiated by processes of interaction. From the space (angle) and energy distribution of the irradiated particles, inferences can be drawn about physical or chemical processes during the interaction, or about features of the relevant particle types, or of the interaction zone. Numerous analytical processes have accordingly been developed, for instance using electron diffraction tests or spectroscopic test.

One problem of the known analytical processes is the simultaneous detection of the angle and energy distribution of a particle beam (e.g., electrons, ions or clusters of ions, atoms or clusters of atoms).

In electron spectroscopic diffraction tests (e.g. RHEED), there is interest, for example, in linking the imaging of diffraction patterns with energy filtration in order to separate elastic and inelastic scattering processes. The modeling of the elastic scatterings enables an improved resolution of the structure. In addition, there is interest in angle-resolved auger electron spectroscopy.

Known systems for resolving locus and energy simultaneously using electron spectroscopy can be divided into two groups. One design works by combining conventional fluorescent screen imaging with a raster scanning mechanism, enabling the scanning of sections of the diffraction pattern and the analysis of their energy. The raster mechanism can comprise either a scan unit for the diffraction image or a sensor element which can be moved in the diffraction image (the so called Channeltron). Systems like that, however, suffer from the disadvantage that they are complicated to assemble and only allow quasi-simultaneous resolution of position and energy. Operating the raster mechanism takes a lot of time, so that real time analyses, for example in surface changes of solids, are only possible to a limited extent.

A second design enables the diffraction image to be observed through spherical grids for filtering energy. A system like this is described for RHEED examinations, for instance, by Y. Horio in Jpn. J. Appl. Phys. (Vol. 35, 1996, p 3559 et seq.) and is explained as follows with reference to FIG. 6.

FIG. 6 shows the use of three spherical grids 61, 62 and 63 in front of an observation screen 64 in a known RHEED apparatus. The spherical grids act as energy filters to screen (extract) inelastically scattered electrons. A deceleration potential $V_+$ has been installed between grids 61 and 62. Grid 63 acts to correct the imaging onto Screen 64. The grids are configured concentrically at intervals at distances of r1, r2 and r3 so that the sample is located in the center of the grid spheres.

Filtering energy using spherical grids has several disadvantages. The assembly requires the location of the imaged sample zone from which the diffraction image is emitted to be centered inside of the spherical grids. Therefore, to achieve practicable image sections and/or construction sizes a small operational distance (approximately 20 to 30 mm) is needed between the sample and the analyzer (inlet window).

The operating distance is fixed by the grid radii and cannot be changed. The small operating distance leads, for instance when used in coating equipment, firstly to spatial problems and secondly to unacceptable contamination of the spherical grids. The contamination is caused by the fact that partial pressure of the substances which are to be deposited can develop in the area of the spherical grids on account of the small operating distance, thus resulting in deposits on the grids and insulators.

In addition, spherical grid analyzers are restricted to extremely small grid apertures so that energy resolution of $\delta E/E < 10^{-2}$ which would be of practical interest can be achieved. Since the operating distance is fixed as a field-free space, deceleration (energy selection) can only occur in the area of the spherical grids over a short distance. The stop or deceleration potential must be fully attached to the spherical grids. In order to achieve sufficient energy resolution, however, the grid apertures must be very small (under 40 mm in size). This is disadvantageous to grid transmittance.

In addition, spherical grid analyzers require at least three grids for distortion-free projection onto a flat screen. This leads to further transmittance loss and thus to a transmittance in the whole configuration of approximately 40%. This is disadvantageous to analytical sensitivity.

Apart from lack of space, there is often the problem in coating equipment (e.g. molecular beam epitaxy chambers or MBE chambers) that because of the given neck flanges an optimal analyzer position can often not be achieved. Using spherical grid analyzers with a precise centering relative to the sample is only possible to a limited degree.

DESCRIPTION OF THE INVENTION

It is an object of the invention to provide an improved device and process for angle and energy resolution imaging of a particle beam, using high energy resolution and sensitivity and providing increased operating distance between detector and sample. It is a further object of the invention to provide a spectrometer which is equipped such a device, and processes for operating and applying it.

The invention is a device for imaging a particle beam with charged particles of a definite energy and angle distribution a on detector. The invention operates by influencing the particle beam (or group of particles) emitted from a sample firstly by deflection so that essentially parallel straight paths are formed which are then directed to an energy selective electrode configuration with semi transmissive electrodes. The electrode configuration forms an opposing or counter field analyzer which acts to filter inelastic scatterings in electron diffraction tests. The mutual configuration of the parallel particle paths contains all the information about the original particle beam's angle distribution. The invention preferably has a deflection and deceleration apparatus for decelerating the particle beam before it reaches the filter electrodes. Essentially parallel particle paths are formed in the particle beam such that the mutual distances correspond to the angle distribution of the particles, the parallel particle paths being directed to the filter electrodes.

Deflection devices in accordance with the invention allow the operating distance between the sample and a detector to be increased significantly as compared with the conventional spherical grid analyzers. The increased operating distances are also linked with advantages relating to sensitivity and resolution capabilities, which are described in greater detail below.

The deflector means comprise a multitude of electromagnetic lenses or other suitable electrodes which are powered downstream with increasing stopping potential such that the particle beam with initially divergent particle paths is converted into a particle beam with parallel paths, in the course of which the particles are decelerated and directed to the energy selective electrode configuration. The deflection devices are also referred to as stop lenses.

The stop lenses have at least two field forming elements (electrodes) which are powered downstream with increasing stopping potential. Preferably, there are three field forming elements. By using the third element in the beam direction outer beams can be captured more easily (outer beam correction). Even more elements can, however, be provided.

The potential functions with which the elements of the stop lens are driven can be computed by an artisan with a knowledge of electrostatics (e.g. for field distribution in cylinder lenses) using the concrete design and the necessary precision, or can be determined using appropriate numerical simulation. For customary analytical applications, e.g. in RHEED tests, the divergence of the particle paths remaining after the paths become parallel should be less than about 0.5°.

Passing the particle beam through a stop lens field in accordance with the invention fulfills a two-fold function. Firstly, a diffraction pattern is formed with parallel particle paths (the so called "parallel diffraction pattern". Secondly, the particles are decelerated. The deceleration should preferably be strong enough that the particles have as little energy as possible when they arrive at an energy selective electrode configuration. The field force at the locus of the energy selective electrode configuration should therefore be as small as possible in order to maintain improved energy resolution. Where, for example, electron diffraction tests are carried out with an electron beam of approximately 15 keV initially, a 90% deceleration is preferred and leads to approximately a 10-fold improvement in energy resolution. This procedure is the same for electrons and ions or other charged particles.

The two semi-transmissive, preferably lattice-shaped, electrodes (so-called filter electrodes) are powered with a potential difference (filter deceleration potential) to create a stop field so that particles with energy below the particle beam's energy threshold are peeled off or separated (extracted) and only higher energy particles are passed to the detector. Because of the conversion of the particle beam into one parallel beam in accordance with the invention, it is possible to make the semi-transmissive electrodes essentially even and to configure them in the parallel beam so that the beam basically meets the semi-transmissive electrodes perpendicularly.

The sensitivity achievable depends on the design of the filter electrodes and their operational parameters, and particularly on the size of the stop field and the grid apertures. Since, in proximity to the grid elements, field distortions occur which influence transmittal and disturb energy selectivity, large grid apertures ($300\mu$ and smaller) are preferred.

After the particle beam has passed through the electrodes, the beam is imaged on a detector. The detector is preferably formed from a flat particle interceptor set up to detect, according to the locus, particle currents arriving. The particle interceptor should ideally be a florescent screen coupled to an optical detector, e.g., a photodiode configuration, a CCD camera or a so called Channelplate. An anode matrix can, however, also be provided as a substitute, to which appropriate electron multiplexers are connected (Channeltron) for examining ion beams.

The particle beam can be accelerated over the distance from the filter electrodes to the detector. However, the space may be field free. The detector can even be connected integrally to the last filter electrode with no intervening distance (e.g., as a Channelplate).

The stop lens, the filter electrodes and the detector are fastened together. The size of an external housing may be adapted to accommodate the design of the components. Sizing for a standard flange (100 mm or 150 mm diameter) is preferred. Assembly should be rotationally symmetrical, although the filter electrodes can be formed in a square.

A spectrometer in accordance with the invention comprises a counter field analyzer as described above. It is preferably operated with two measuring channels, whose sensitivity and dynamic properties are adjusted for the detection of the angle distribution and energy distribution.

The measurement processes in accordance with the invention consist of energy selective observation of the particle beam cross-section (e.g., of a diffraction pattern), preferably as a real time measurement during a growth process on the surface of a solid, imaging of a resolved energy loss spectra locus, auger electron spectra, or the implementation of traditional diffraction tests (e.g., RHEED) with a change in the visual field.

Devices in accordance with the invention and their use in spectroscopic measurement methods have the following advantages. A large operating distance enables the filter electrodes and the detector element to be spaced sufficiently far away from the sample to eliminate space problems in relation to other components of a measuring arrangement. The creation of a parallel beam simplifies imaging on a detector. Corrective imaging filter electrodes can therefore be abandoned, thereby avoiding the associated decrease in transmittance.

Both the distance from the detector to the sample and the operating distance can be controlled by adjusting the deflectors' potentials. As a result, systems in accordance with the invention can be adapted to different test sites by adjusting the potentials.

Particularly when measuring in situ in an MBE device, all analyzer elements outside the chamber can be configured so that there is no disturbing partial pressure from the vaporizers. Contamination is thereby eliminated, which improves reliability. At the same time, an angular correction is possible using the deflectors to compensate in situations where the analyzer in the MBE chamber cannot be put in an optimal position (rectification of faulty alignments).

It is possible for the first item to provide a large operating distance with an angle analysis encompassing angles as large as 15 to 20° in the primary particle beam emitted from the sample.

The deflector means selection can determine the visual field actually covered. A zoom effect can be achieved by a simple variation of the voltage on the stop lenses.

Providing a decelerated parallel beam enables the use of a larger grid apertures on the filter electrodes, thereby increasing the transmittance of the whole stop configuration to approximately 80% and providing a greater degree of sensitivity. In addition, filter electrodes with larger grid apertures are easier to manufacture and handle, and provide a high degree of reliability.

Devices in accordance with the invention allow excellent energy resolution of about $10^{-4}$. As a result, a primary beam of 15 keV energy distribution with characteristic widths of 2 eV can be resolved. Energy resolution can be affected by the potentials of the deflectors. Energy resolution is proportionate to the field force in the energy selective electrode configuration. High field strengths cause greater energy widths or smaller resolution.

Design of the detector, e.g., as combination of a fluorescent screen with a CCD camera or Channelplate, can permit operation with very small electron currents.

The invention may be used in the analysis of any charged particles, and is not limited to electron diffraction investigations.

DESCRIPTION OF THE PREFERRED EMBODIMENTS

The embodiments illustrated below provide preferred examples of compact devices in accordance with the invention. The examples are intended to be illustrative but are not intended to limit the scope of the appended claims.

For example, the invention is not limited to compact design. On the contrary, it is also possible to have designs which are axially extended so that the sample is placed as far away as possible from the detector because of its temperature or to avoid contamination.

Figure 1:
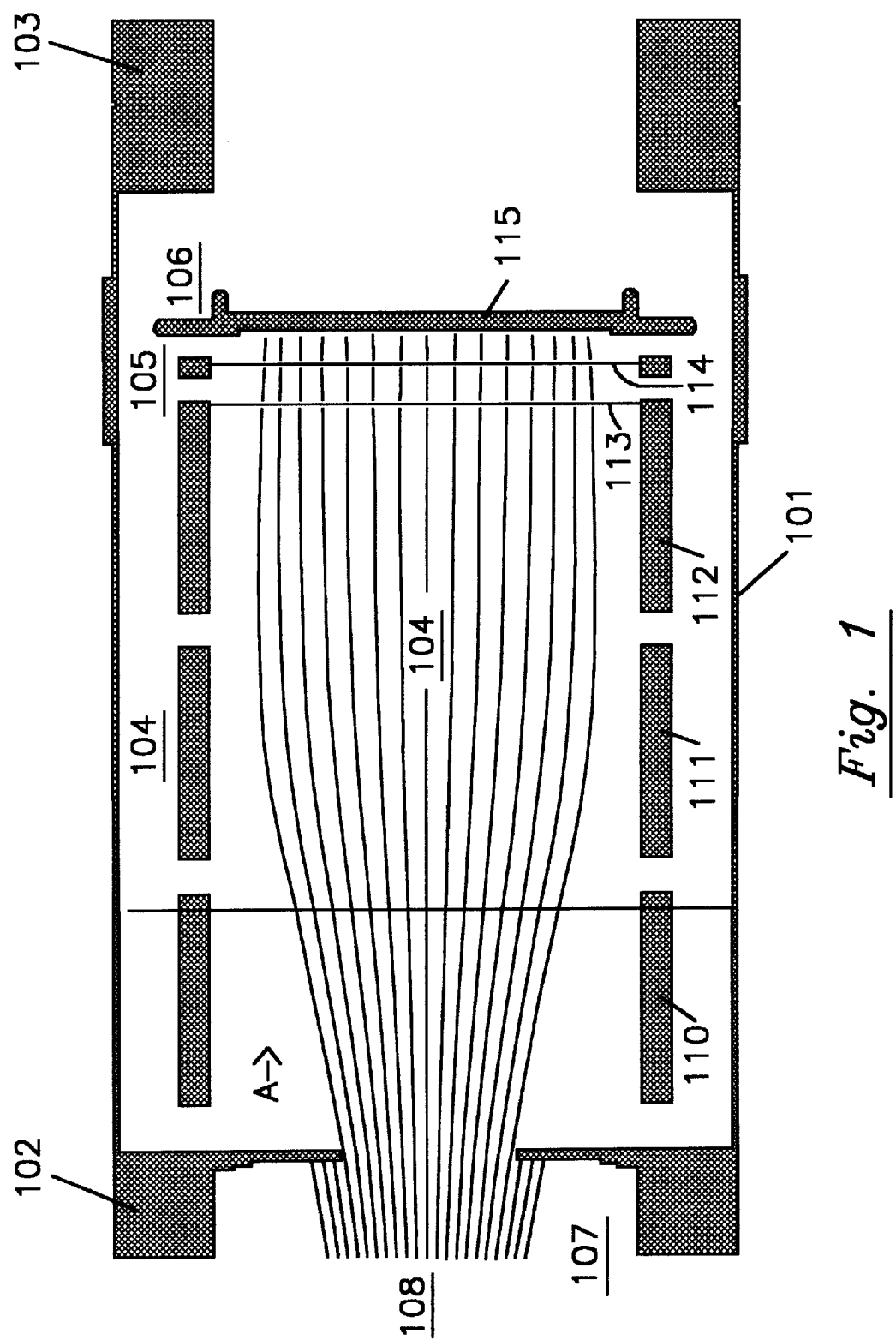
FIG. 1 is schematic diagram of a device in accordance with the invention, shown in cutaway view.

FIG. 1 shows a cutaway view of an analyzer assembly 100 in accordance with the invention for resolving imaging of an electron beam with a definite energy and energy distribution. Housing 101, in the form of a cylinder which has fastenings 102 and 103 at its ends, has a deflection range 104, filter range 105 and detector range 106. The deflectors in the deflection range 104 are formed by stop lenses 110, 111 and 112. Filter range 105 contains filter electrodes 113 and 114 which are basically formed by even grid-like electrode nets. The detector element in detector range 106 is fluorescent screen 115 which works in conjunction with appropriate sensors (not shown). The sensors can comprise a CCD camera, a photodiode and/or an electron multiplier (see FIGS. 2, 3). The feeders and fastenings of the individual components are not shown. The fluorescent screen 115 is electrically conducting to prevent charging. For very sensitive measurements with small currents the fluorescent screen can be replaced by a Channelplate electron multiplier. The fluorescent screen is then attached behind the Channelplate.

In operating conditions electron beam 108 enters housing 100 through inlet 107. Electron beam 108 is for example a group (beam) of electrons, which form divergent particle paths after scattering on a sample surface. The paths are shown in the graphs by lines with a 1° graduation per line respectively. Inlet 107 forms an aperture with which part of the scattered group is captured. The electron beam captured contains an angle distribution of scattered electrons which can be represented by an electron current distribution through a plane which is cut by the electron beam, e.g., the plane of inlet 107.

The electrons move under the influence of the fields emanating from stop lenses 110, 111 and 112 in the direction of arrow A, whereas a group of electrons (electron beam 109) is formed with essentially parallel, even particle paths. Electron beam 109 forms a distribution of electron current distributed through a plane perpendicular to the direction of motion A, with the distribution corresponding to the original angle distribution.

Electron beam 109 meets first filter electrode 113 which has the same potential as stop lens 112. The grid apertures of the first filter electrode 113 are approximately 300 µm in size but can also be smaller. The electrons entering the grid apertures come up against a filter stop potential at the second filter electrode 114 which preferably has the same geometric configuration as the first filter electrode 113.

The electrons which have sufficiently high energy to pass through the grid apertures of second filter electrode 114 against the stop potential strike fluorescent screen 115. An acceleration potential is preferably created between fluorescent screen 115 and the second filter electrode 114.

Examples of potential values for stop lenses 110, 111 and 112 are, respectively, –10.3 kV, –17.4 kV and –17.5 kV (housing to ground). Stop lens 112 provides outer beam correction. By controlling these potentials one can determine the size of the section of the electron beam which has passed through inlet 107 and which meets the first filter electrode 113, i.e., the size of the visual field of the detector element. Lateral interceptor electrodes can be attached to capture the part of the beam which does not strike the visual field.

The potential of the second filter electrode 114 can, for instance, be –20 kV, but can be varied for most applications using a control (not shown), in order to facilitate energy selection. Fluorescent screen 115 can have a potential of approximately 19 kV.

An energy threshold is determined by the potential of second filter electrode 114. Electrons with energy less than or equal to the energy threshold are not capable of passing through the stop potential. Electrons with higher energy will achieve the acceleration potential to the fluorescent screen. Because of this characteristic the stop potential is a filter potential with high-pass properties.

Figure 2:
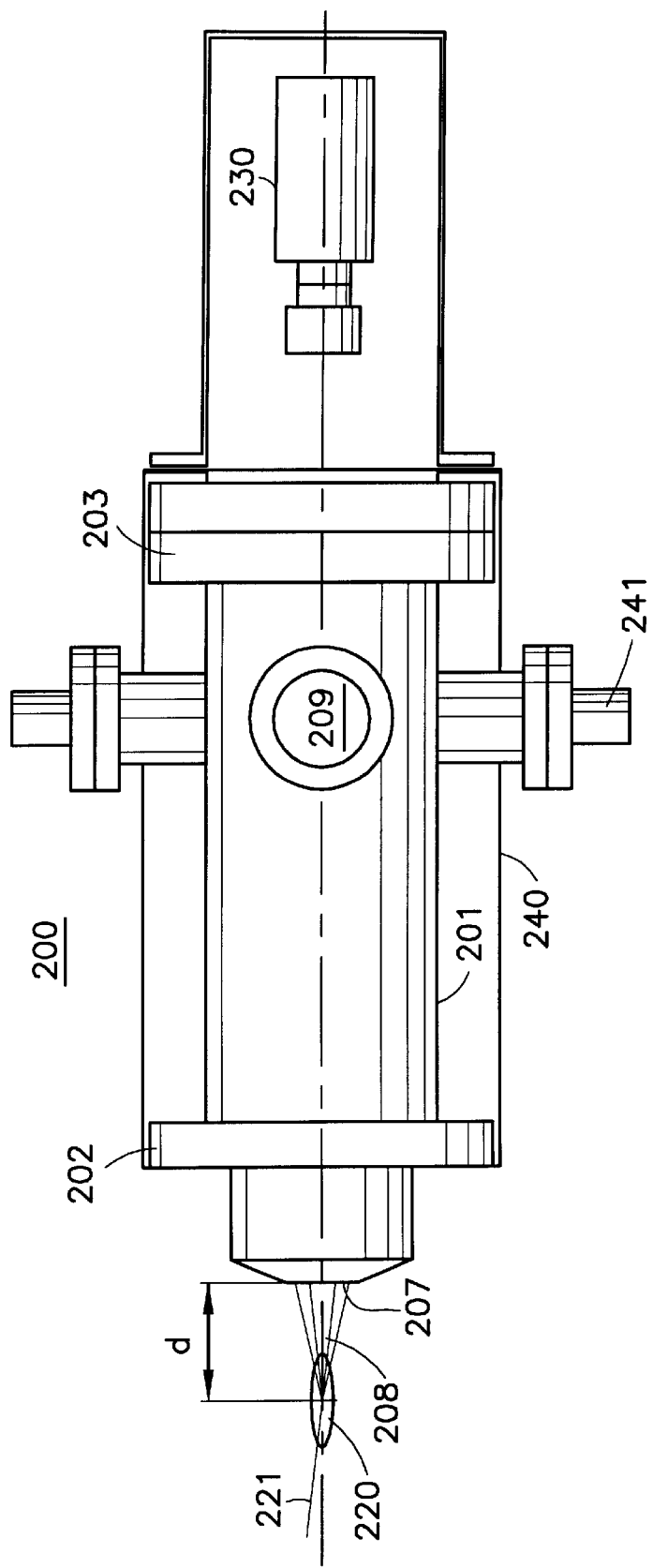
FIG. 2 is a schematic diagram of a spectrometer in accordance with the invention, shown in partial section.

FIG. 2 shows a spectrometer 200 in accordance with the invention (measurement component, without control or similar) which contains in cylindrical housing 201 an analyzer assembly according to FIG. 1.

Sample 220 is grazed by primary beam 221. Electron beam 208 with diverging paths, which has been diverted enters the analyzer assembly through inlet 207, is converted with the deflectors (not shown) into a beam 209 with parallel paths, filtered with the filter electrodes (not shown) and imaged onto a fluorescent screen or image enhancer which is captured with video-camera 230.

Housing 201 has an external metal shielding 240 on its fasteners 202 and 203. Fastener 202 can, for example, be a flange fitted to a vacuum chamber. Flanges 241 are provided on the side of the housing 201 for electric power and control connections.

The operating distance d between sample 220 and inlet 207 is variable and can be between 50 and 100 mm.

Figure 3:
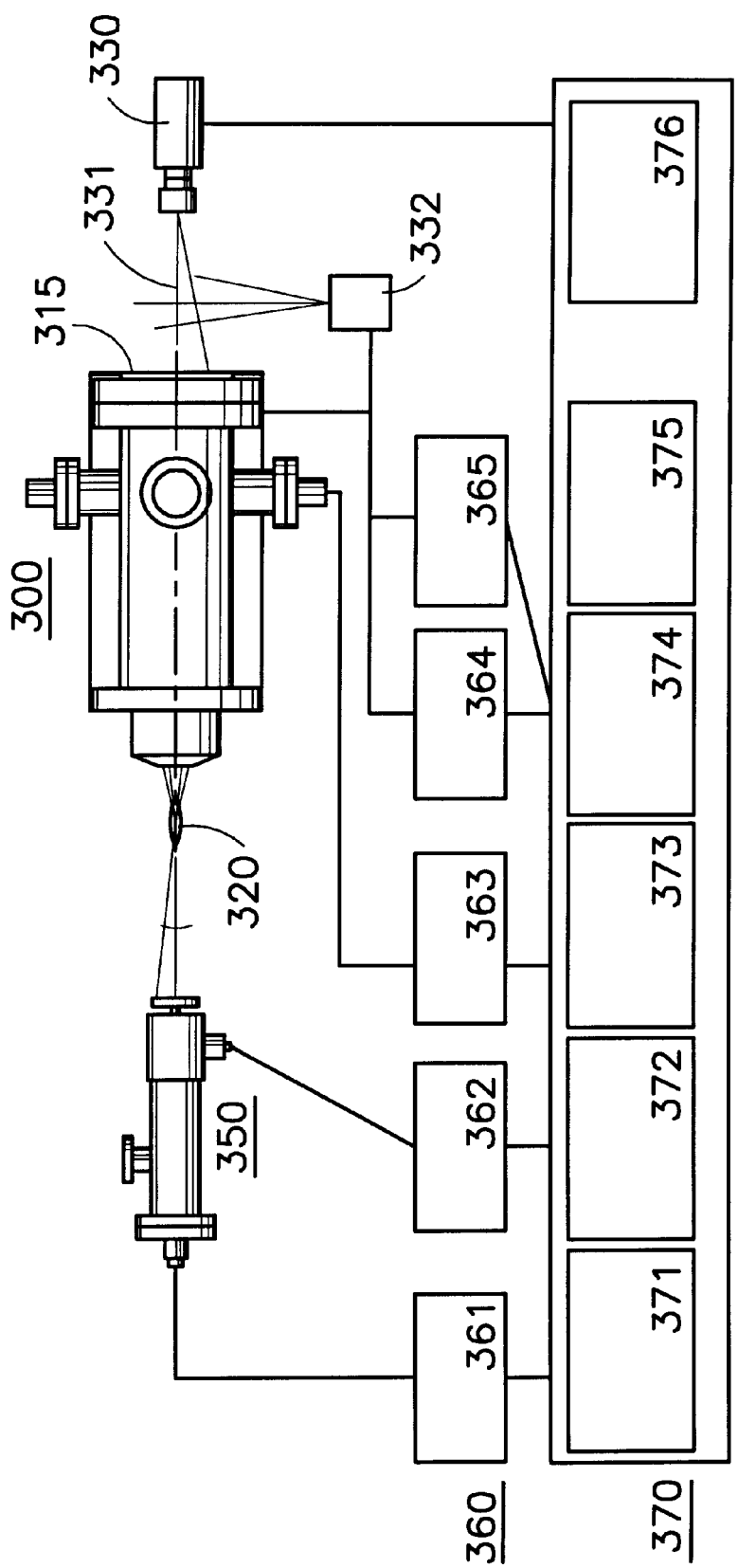
FIG. 3 shows an example of a RHEED apparatus with a spectrometer in accordance with the invention.

FIG. 3 shows a RHEED apparatus with a RHEED electron beam source 350, a spectrometer 300 in accordance with the invention, control elements 360 and a data processing unit 370. Electron beam source 350 is for irradiating sample 320.

The scattered group of electrons is captured by spectrometer 300 which essentially corresponds to the design shown in FIG. 2.

In the embodiment shown in FIG. 3 the analyzer is operated using two measuring channels at the same time. The diffraction pattern on fluorescent screen 315 which has passed through the filter device is captured by an optical system containing beam splitter 331. Beam splitter 331, on the one hand, permits detection of an image using a two dimensional detector, e.g., CCD camera 330, and on the other hand, enables detection of a signal corresponding to the integral luminance of the diffraction pattern using rapid response dynamic sensor 332, e.g., a photodiode or a photomultiplexer. This has the advantage of enabling detection of the image using a relatively slow camera.

No details of the optical system (lenses, etc.) are shown.

Rapid integral measurement with a high dynamic range on the other hand allows a lock in measurement characterized by a low signal/noise ratio and direct taking of energy loss spectra. Taking the filter grid stop potential enables the detection of electron currents which are adjusted according to the energy of the electrons which have passed through in the time frame. Since the stop grid configuration as a filter stage shows a high pass energy loss, spectra can be taken directly over the time derivatives of the electron currents.

Control elements 360 and 370 of the RHEED apparatus are shown in a block diagram in FIG. 3. Control elements 360 comprise supply unit 361 of electron beam source 350, a deflection unit 362 for electron beam source 350, spectrometer control unit 363, lock in system 364 and a current amplifier 365. Data processing unit 370 preferably as computer control comprises circuit 371 to provide modulation of control signals for supply unit 361, circuit 372 to provide irradiation parameters, circuit 373 to supply spectrometer control signals, circuit 374 for lock in data input, circuit 375 for control of growth functions using an MBE apparatus (not shown here) and circuit 376 for image processing and displays. Circuit 374 for lock in data input contains rapid 16 bit data input.

The aforementioned zoom effect after adjustment of the voltage variation on the stop lenses is axial because of the lens symmetry. In order to be able also to adjust the imaged test section other than axially (image shifts), a system in accordance with the invention can be equipped additionally with means of image shifting which are shown in three cutaway diagrams in FIG. 4. FIG. 4 shows an analyzer assembly 400 which is basically like analyzer assembly 100 in FIG. 1 with external housing 490.

Image shifters 480 in the shape of at least one further deflection unit are configured between sample 420 and inlet 402. Preferably, two deflection units 480a and 480b should be provided since in dual deflection paralleling is possible as early as the image shift. The deflection units are set for magnetic beam influence since smaller image defects can be achieved with magnetic fields. When using solenoids, these must be assembled in a vacuum using suitable materials. Electrical deflection units are, however, also possible (electrostatic deflection plates). Aperture 416 can also be placed between deflection units 480 and inlet 402 to restrict the beam.

Figure 4A:
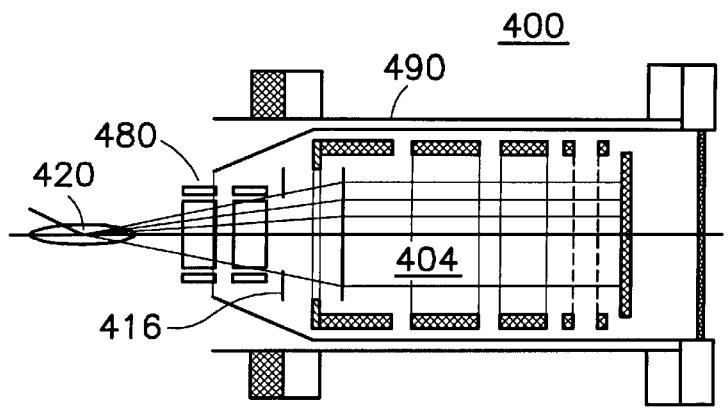
FIGS. 4A–4C is another schematic diagrams of a device in accordance with the invention shown in three schematic cutaway views to illustrate image shift.
Figure 4B:
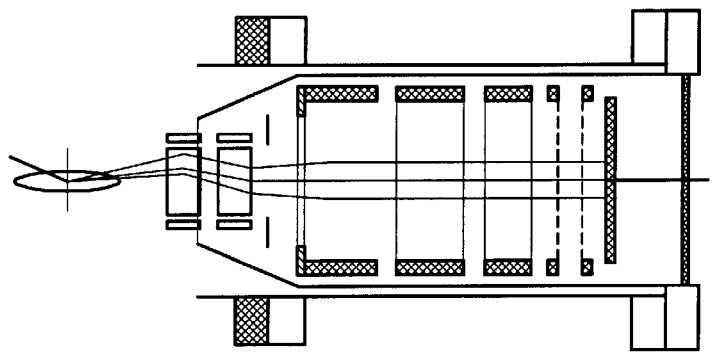
Figure 4C:
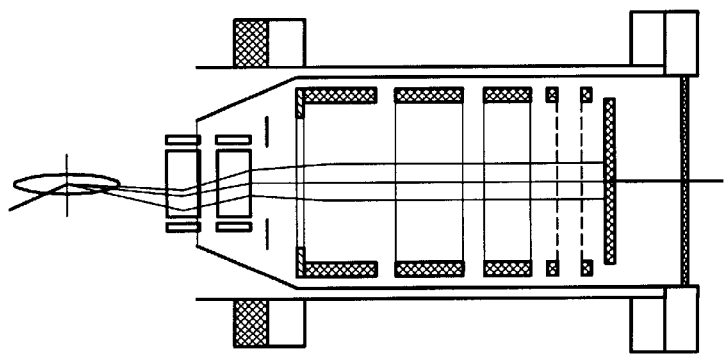

FIGS. 4a, 4b and 4c show, respectively, imaging diagrams without image shift (a, like FIG. 1), with image shift downwards (b) and with image shift upwards (c).

By proper selection of image shifts means 480 and deflection means 404, selection of an image section of the sample which is being observed can be successfully combined with the zoom effect.

Figure 5A:
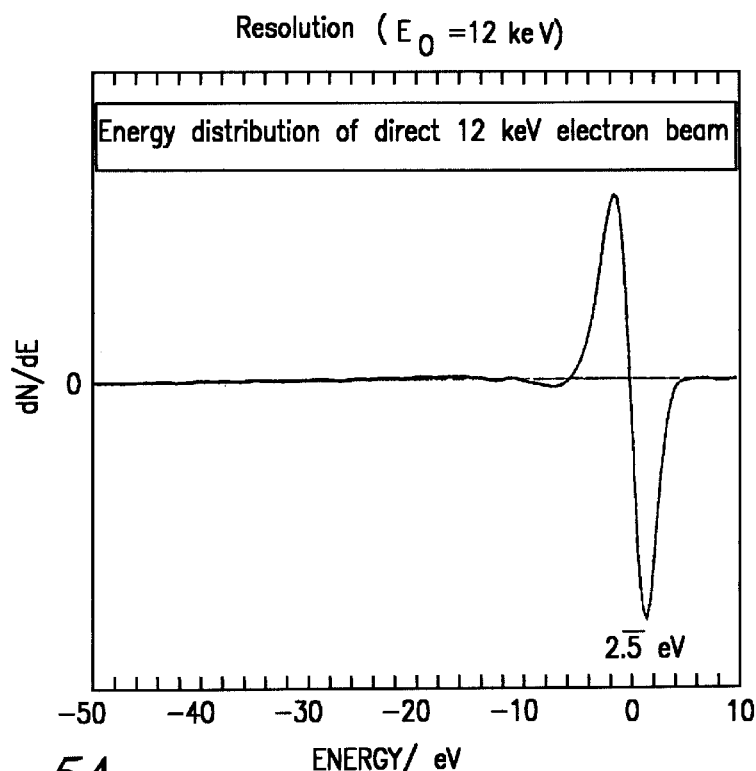
FIGS. 5a and 5b are graphs illustrating the energy resolution of a spectrometer in accordance with the invention (5a) and of an energy loss spectrum (5b), which were measured with a spectrometer in accordance with the invention.
Figure 5B:
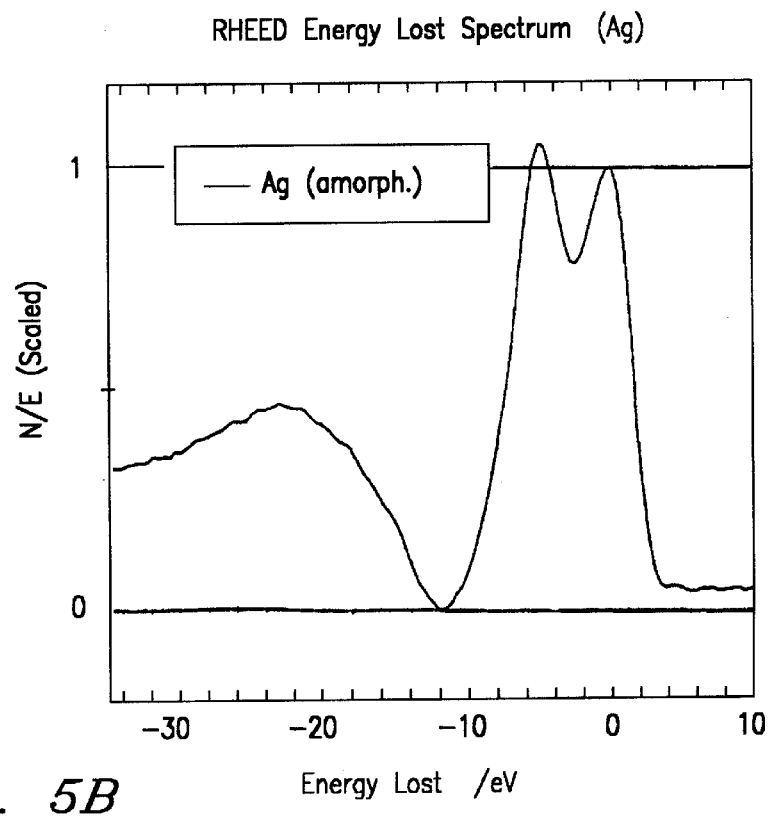
Figure 6:
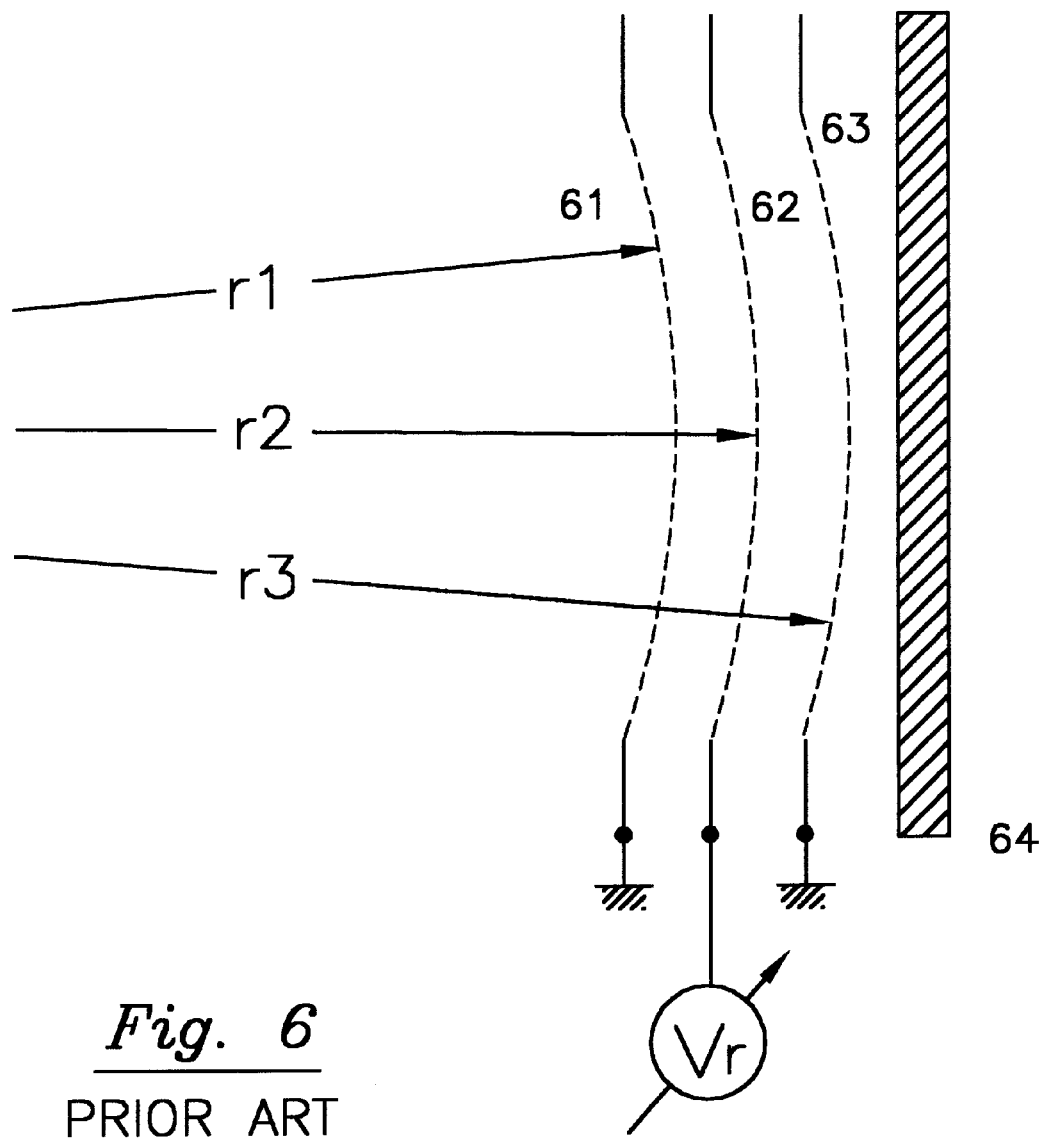
FIG. 6 is a cutaway view of spherical grids in a prior art RHEED apparatus.

Important advantages of an analyzer assembly which conforms to the invention can be seen in FIGS. 5a and 5b. FIG. 5a shows the first derivation of the intensity energy function of a 12 keV electron beam. The half-width of the intensity distribution (distance of the reverse points) amounts to 2.5 eV which corresponds to prominent energy resolution of approximately $2-10^{-4}$. The energy loss spectrum of a silver sample shown in FIG. 5b shows separated highs at 4 and 23 eV. The location of the highs is specific to the substance so that with a spectrometer which conforms to the invention highly exact chemical analyses can be carried out on the surfaces of matter.

In accordance with the invention, traditional analytical processes with angle and energy distribution can be modified to the effect that prior to the taking of diffraction images of energy loss spectra, a more interesting area of the visual field is first selected and then analyzed. A preferred application of the invention is the real time observation of coating or adsorption or ablation processes in vacuum coating devices, e.g., in MBE chambers.

The invention can also be used to advantage in the following systems: RHEED appliances with energy filtration to separate elastic and inelastic scatterings or to eliminate Kikuchi lines in ion spectrometers and mass spectrometers, any angle resolving energy analyzer, and electron spectroscopic holography. An important application of the invention relates to ion scattering spectroscopy (ISS). Here the energy distribution of backscattered ions is measured for a specific angle which is as small as possible. The invention allows one now to measure energy and angle simultaneously. With surface holography the angle distribution of diffusely scattered electrons is measured.

Structures of the distribution are interpreted after numerical processing and indicate holographic effects which are produced by adsorbates or structures on the surface.

Though the invention has been described with reference to specific embodiments, various modifications, omissions, changes and substitutions may be made without departing from the spirit and scope of the invention defined in the appended claims.

What is claimed is:

1. An apparatus for imaging on a detector a particle beam comprising charged particles from a sample having a distinct energy distribution, a distinct angle distribution and a direction of propagation comprising semi-transmissive filter electrodes arranged to generate a potential difference to create a deceleration field and to allow particles of said particle beam to pass through by means of energy selectivity; and at least one stop lens deflector positioned between said sample and said semi-transmissive filter electrodes to create in the particle beam essentially parallel particle paths which are spaced in proportion to the angle distribution of the particles and which are directed to the filter electrodes, wherein said at least one stop lens is positioned closer to said semi-transmissive filter electrodes than is said sample and comprises at least two field forming electrodes being arranged to be powered with increasing stopping potentials.

2. The apparatus according to claim 1, further comprising a plurality of stop lenses which have increasing deceleration potentials in the direction of propagation of the particle beam.

3. The apparatus according to claim 2, wherein the filter electrodes comprise first and second filter electrodes between which is formed a filter stop potential which determines an energy threshold, wherein said charged particles below said energy threshold are stopped by said filter stop potential.

4. The apparatus according to claim 3, wherein the deceleration potentials of the stop lenses and the filter stop potential are capable of imaging particles selected from the group consisting of electrons, ions, groups of ions, charged groups of atoms and charged groups of molecules.

5. A spectrometer, comprising an apparatus in accordance with claim 4.

6. The apparatus according to claim 1, wherein the filter electrodes form planes which are substantially parallel to each other, the filter electrodes comprising substantially linearly-aligned grid electrodes configured in such a way that the substantially parallel particle paths are substantially perpendicular to the planes of the filter electrodes.

7. The apparatus according to claim 1, wherein the filter electrodes comprise first and second filter electrodes between which is formed a filter stop potential which determines an energy threshold, wherein said charged particles below said energy threshold are stopped by said filter stop potential.

8. The apparatus according to claim 1, wherein the detector comprises an imaging screen to create an optical image and a sensor to capture the optical image.

9. The apparatus according to claim 8 wherein the sensor comprises an imager for taking an image having an integral luminance, and a sensor capable of detecting a signal which corresponds to the integral luminance of the image.

10. A spectrometer, comprising an apparatus in accordance with claim 1.

11. An apparatus in accordance with claim 1, wherein said particle beam is propagated in one direction substantially along a longitudinal axis as the particle beam is passed from said sample to said at least one stop lens deflector and finally to said semi-transmissive filter electrodes.

12. An apparatus in accordance with claim 11, wherein said at least two field forming electrodes are at spaced separation and each comprises first and second ends extending substantially along said longitudinal axis, wherein said particle beam passes one time and in one direction through said at least two field forming electrodes by initially passing said first ends, then passing between said at least two field forming electrodes, within said spaced separation, and finally passes said second ends and propagates directly to said semi-transmissive filter electrodes.

13. A process for imaging on a detector means a particle beam comprising charged particles having a distinct energy distribution and a distinct angle distribution, wherein the particle beam passes through semi-transmissive filter electrodes which are capable of generating a potential difference to create a deceleration field in order to allow particles to pass through by means of energy selectivity, the steps which comprise:

directing said charged particles onto essentially parallel particle paths to the filter electrodes such that the spacing between the parallel paths is proportional to the angle distribution by passing said charged particles in substantially one direction through at least one stop lens deflector, wherein said at least one stop lens deflector comprises two field forming electrodes which are powered with increasing stopping potentials.

14. The process according to claim 13, further comprising directing a predetermined section of the particle beam onto filter electrodes using image shifters and deflectors.

15. A process in accordance with claim 13, wherein said two field forming electrodes are at spaced separation and each comprises first and second ends extending substantially along a longitudinal axis, wherein said particle beam propagates from a sample in a direction substantially along said longitudinal axis through said field forming electrodes and then directly to said filter electrodes, said two field forming electrodes being positioned closer to said filter electrodes than is said sample, wherein said particle beam propagated through said two field forming electrodes in substantially one direction initially passes said first ends, then passes between said two field forming electrodes within said spaced separation, and finally passes said second ends and propagates directly to said semi-transmissive filter electrodes, whereby said particle beam is propagated one time through said two field forming electrodes.

16. An imaging device for imaging a particle beam of charged particles, wherein said particle beam is imaged in a direction substantially along a longitudinal axis, said imaging device comprising:

(a) a stop lens through which said particle beam can propagate in one downstream direction, said stop lens comprising at least two electrodes at spaced separation and each comprising first and second ends extending substantially along said longitudinal axis, said electrodes being aligned in order of increasing potential as an absolute value according to said downstream direction, said particle beam propagating in said downstream direction by initially passing said first ends of said at least two electrodes within said spaced separation and finally passing said second ends of said at least two electrodes, wherein said stop lens decelerates said charged particles and directs said charged particles onto essentially parallel paths as said particle beam propagates through said stop lens in said downstream direction;

(b) a filter electrode aligned with said stop lens and positioned downstream of said stop lens, said filter electrode receiving said particle beam directly from said stop lens after said particle beam passes said second ends of said at least two electrodes, said filter electrode producing a potential capable of extracting a portion of said charged particles from said particle beam below an energy threshold while decelerating said charged particles not below said energy threshold; and (c) a charged particle detector aligned with said filter electrodes and positioned downstream of said filter electrodes.

17. The imaging device according to claim 16, wherein said filter electrode comprises a grid electrode that is substantially perpendicular to said essentially parallel paths of said charged particles.

18. The imaging device according to claim 16, wherein said filter electrode comprises a first filter electrode and a second filter electrode, and wherein said second filter electrode produces a stop potential which establishes an energy threshold for extraction of said low energy charged particles.

19. The imaging device according to claim 16 wherein said charged particle detector comprises an imaging screen and a sensor and is capable of producing an optical image.

20. A method of imaging a particle beam of charged particles propagating along a longitudinal axis and at angles to said axis, respectively, comprising:

(a) deflecting a number of said charged particles with at least one stop lens deflector such that said number of said charged particles propagate along paths essentially parallel to said axis, said paths being spaced proportionally to said angles, wherein said at least one stop lens deflector comprises at least two field forming electrodes which are powered with increasing stopping potentials, said at least two field forming electrodes being at spaced separation and each comprising first and second ends extending substantially along said longitudinal axis, said particle beam propagating one time through each of said at least one stop lens deflector by propagating past said first ends, between said at least two field forming electrodes in said spaced separation, and directly out from said second ends;

(b) screening said charged particles through a deceleration potential to extract a portion of said charged particles below an energy threshold; and (c) imaging said charged particles not extracted in said screening step.

* * * * *